United States Patent
Steimle et al.

(10) Patent No.: US 9,434,602 B2
(45) Date of Patent: Sep. 6, 2016

(54) REDUCING MEMS STICTION BY DEPOSITION OF NANOCLUSTERS

(71) Applicants: Robert F. Steimle, Austin, TX (US); Ruben B. Montez, Cedar Park, TX (US)

(72) Inventors: Robert F. Steimle, Austin, TX (US); Ruben B. Montez, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 143 days.

(21) Appl. No.: 14/446,910

(22) Filed: Jul. 30, 2014

(65) Prior Publication Data
US 2016/0031698 A1 Feb. 4, 2016

(51) Int. Cl.
*B81B 3/00* (2006.01)
*B81C 1/00* (2006.01)

(52) U.S. Cl.
CPC ........ *B81B 3/001* (2013.01); *B81B 2201/0235* (2013.01); *B81B 2203/0181* (2013.01)

(58) Field of Classification Search
None
See application file for complete search history.

(56) References Cited

U.S. PATENT DOCUMENTS

| | | | |
|---|---|---|---|
| 5,679,436 A * | 10/1997 | Zhao | 428/141 |
| 7,251,893 B2 | 8/2007 | Cohen et al. | |
| 7,711,239 B2 | 5/2010 | Sasagawa et al. | |
| 7,758,708 B2 | 7/2010 | Mitlin et al. | |
| 7,768,366 B1 | 8/2010 | Patton et al. | |
| 8,236,379 B2 | 8/2012 | Kobrin et al. | |
| 8,241,698 B2 | 8/2012 | Cohen et al. | |
| 8,351,106 B2 | 1/2013 | Kim | |
| 8,394,679 B2 | 3/2013 | Eaton et al. | |
| 8,436,453 B2 | 5/2013 | Jacobs et al. | |
| 2004/0249469 A1 | 12/2004 | Cohen et al. | |
| 2006/0189079 A1* | 8/2006 | Merchant et al. | 438/260 |
| 2007/0082495 A1* | 4/2007 | Mathew et al. | 438/706 |
| 2007/0127164 A1 | 6/2007 | Ofek et al. | |
| 2007/0247401 A1 | 10/2007 | Sasagawa et al. | |
| 2008/0149832 A1 | 6/2008 | Zorn | |
| 2008/0160268 A1 | 7/2008 | Jacobs et al. | |
| 2008/0171219 A1 | 7/2008 | Mitlin et al. | |
| 2008/0228280 A1 | 9/2008 | Cohen et al. | |
| 2008/0241512 A1 | 10/2008 | Boris et al. | |
| 2008/0248263 A1 | 10/2008 | Kobrin | |
| 2009/0011222 A1 | 1/2009 | Xiu et al. | |
| 2009/0136657 A1 | 5/2009 | Slafer | |
| 2010/0020311 A1 | 1/2010 | Kirby et al. | |
| 2010/0283138 A1 | 11/2010 | Chen et al. | |
| 2011/0272796 A1 | 11/2011 | Eaton et al. | |
| 2012/0013967 A1 | 1/2012 | Kim | |
| 2012/0196381 A1 | 8/2012 | True et al. | |
| 2012/0275026 A1 | 11/2012 | Zhou et al. | |
| 2013/0265216 A1 | 10/2013 | Ma et al. | |

* cited by examiner

Primary Examiner — Asok K Sarkar

(57) ABSTRACT

Certain microelectromechanical systems (MEMS) devices, and methods of creating them, are disclosed. The method may include forming a structural layer over a substrate; forming a mask layer over the structural layer, wherein the mask layer is formed with a material selective to an etching process; forming a plurality of nanoclusters on the mask layer; and etching the structural layer using at least the etching process.

16 Claims, 6 Drawing Sheets

REDUCING MEMS STICTION BY DEPOSITION OF NANOCLUSTERS

BACKGROUND

1. Field

This disclosure relates generally to manufacture of microelectromechanical systems, and more specifically, to reducing stiction in MEMS devices through the use of nanoclusters as a micro-masking layer.

2. Related Art

Microelectromechanical systems (MEMS) devices are micromechanical devices that provide moving parts having features with dimensions below 100 μm. These moving parts are formed using micro-fabrication techniques. MEMS devices have holes, cavities, channels, cantilevers, membranes, and the like. These devices are typically based on silicon materials and use a variety of techniques to form the proper physical structures and to free the mechanical structures for movement.

Stiction is a static friction force that is a recurrent problem with typical MEMS devices. While any solid objects pressing against each other without sliding require some threshold of force (stiction) to overcome static cohesion, mechanisms generating this force are different for MEMS devices. When two surfaces with areas below the micrometer range come into close proximity, the surfaces may adhere together due to electrostatic and/or Van der Waals forces. Stiction forces at this scale can also be associated with hydrogen bonding or residual contamination on the surfaces.

For MEMS devices such as accelerometers, surfaces such as over-travel stops come into close proximity or contact during use at the limits of the device design. In those situations, stiction forces can cause the MEMS device parts (e.g., a teeter-totter accelerometer mechanism) to freeze in place and become unusable. Traditional methods of avoiding such close proximity travel or contact include increasing spring constants and increasing distance between parts of the MEMS device. But compensating for stiction in this manner can decrease sensitivity of the device, and therefore decrease the utility of the MEMS device. It is therefore desirable to provide a mechanism for reducing stiction-related interactions of MEMS devices without also decreasing sensitivity of the MEMS device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Embodiments of the present invention provide a mechanism for reducing stiction in a MEMS device by decreasing surface area between two surfaces that can come into close contact. Reduction in surface area is achieved by increasing surface roughness of one of the contact surfaces. Embodiments provide such increased roughness by forming a masking layer on a sacrificial layer used in formation of the MEMS device, forming nanocrystals on the masking layer, etching the masking layer, and etching the surface of the sacrificial layer to form pillars or bumps on one or more lower contact surfaces. A second set of contact surfaces that are adjacent the first set of contact surfaces on a subsequent portion of the MEMS device are smooth. The rougher surface of the first set of contact surfaces decreases the surface area available for contact with the second set of contact surfaces thereby decreasing the area where stiction can occur.

Figure 1:
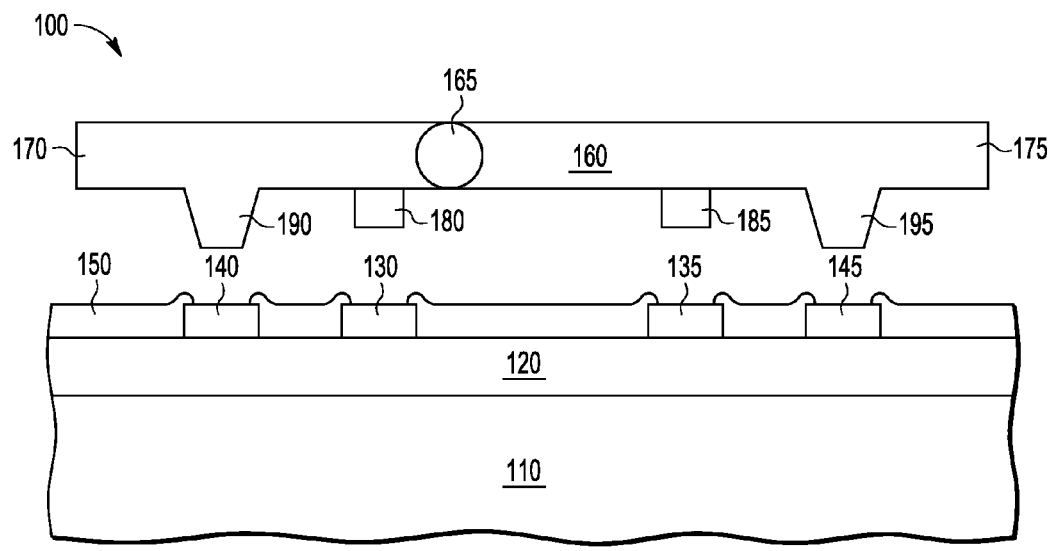
FIG. 1 is a cross-sectional side view diagram illustrating a cross section view of an accelerometer known in the prior art.

FIG. 1 is a cross-sectional side view diagram illustrating a cross section view of a teeter totter accelerometer 100 as known in the art. Accelerometer 100 includes a substrate 110 with an insulating layer 120. Substrate 110 can be, for example, a silicon wafer and insulating layer 120 can be, for example, a silicon oxide or silicon nitride. In some cases, insulating layer 120 can be thermally grown from substrate 110 or insulating layer 120 can be deposited.

Fixed electrodes 130 and 135 are formed on top of insulating layer 120, along with travel stop regions 140 and 145. The layer forming fixed electrodes 130 and 135 and travel stop regions 140 and 145 can be made from a layer of polysilicon formed using conventional techniques, including patterning the layer as desired for the application. The layer forming fixed electrodes 130 and 135 and travel stop regions 140 and 145 can alternatively be amorphous silicon, silicon carbide, silicon germanium, single crystal silicon, a nitride, a metal-containing material, another suitable material, and the like, or any combination thereof. A dielectric layer 150 is formed to electrically isolate the electrodes and travel stop regions from other elements of the MEMS accelerometer. Dielectric layer 150 can be formed from a variety of materials, including, for example, silicon nitride, silicon dioxide, silicon oxynitride, and the like.

A pivoting proof mass 160 is configured to move in a manner similar to that of a teeter totter upon acceleration.

Pivoting proof mass 160 can be configured in a manner such that there is an imbalance between a side 170 of the pivoting proof mass and side 175 of the pivoting proof mass through pivot point 165. The amount of imbalance will have an effect of making the device more or less sensitive to acceleration. An electrode 180 configured on side 170 of the pivoting proof mass is associated with fixed electrode 130, while an electrode 185 on the pivoting proof mass is associated with fixed electrode 135. In addition, a travel stop 190 on side 170 of the pivoting proof mass is associated with travel stop region 140 and a travel stop 195 on side 175 of the pivoting proof mass is associated with travel stop region 145. Pivoting proof mass 160, including travel stops 190 and 195 can be formed of polysilicon or other suitable material.

Electrode 180 and fixed electrode 130 form a first variable sense capacitor, while electrode 185 and fixed electrode 135 form a second variable sense capacitor. Changes in the capacitances of the first and second variable sense capacitors can be combined to provide a differential output from MEMS accelerometer 100.

Fabrication of the components of MEMS accelerometer 100 can be performed using known MEMS fabrication processes. Depending on the direction of movement, when acceleration on pivoting proof mass 160 is sufficient to exceed the design specification for the accelerometer, travel stop 190 or 195 impacts respective travel stop region 140 or 145, thereby preventing contact of electrode 180 or 185 to respective fixed electrode 130 or 135. In this case, however, stiction forces such as Van der Waals, electrostatic, and/or hydrogen bonding can cause the surface of travel stop 190 or 195 to stick to the travel stop region 140 or 145.

Figure 2:
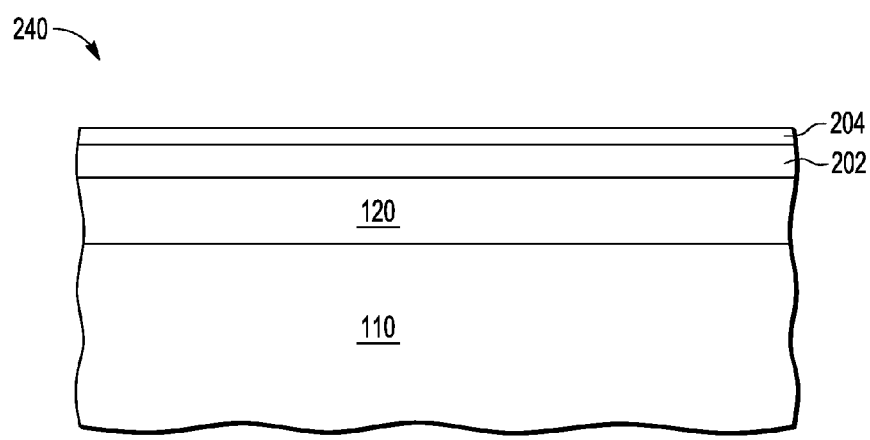
FIG. 2 is a cross-sectional side view diagram illustrating a close up of a cross section view of the travel stop region at an end of a MEMS accelerometer during a stage of fabrication.

FIG. 2 is a cross-sectional side view diagram illustrating a close up of a cross section view of an embodiment of a travel stop region 240 that can be used instead of travel stop regions 140, 145 at ends 170 and 175 of MEMS accelerometer 100 during a stage of fabrication. As discussed above, a substrate 110 is provided with insulating layer 120, where substrate 110 can be a silicon wafer and insulating layer 120 can be a silicon oxide or other suitable material. A first MEMS structural layer 202 such as polysilicon or other suitable material is formed on insulating layer 120. A hard mask layer 204 is formed over structural layer 202. Hard mask layer 204 can be formed of silicon oxide (SiO2), silicon rich nitride (SiRN), silicon nitride (Si3N4) or other suitable material.

Figure 3:
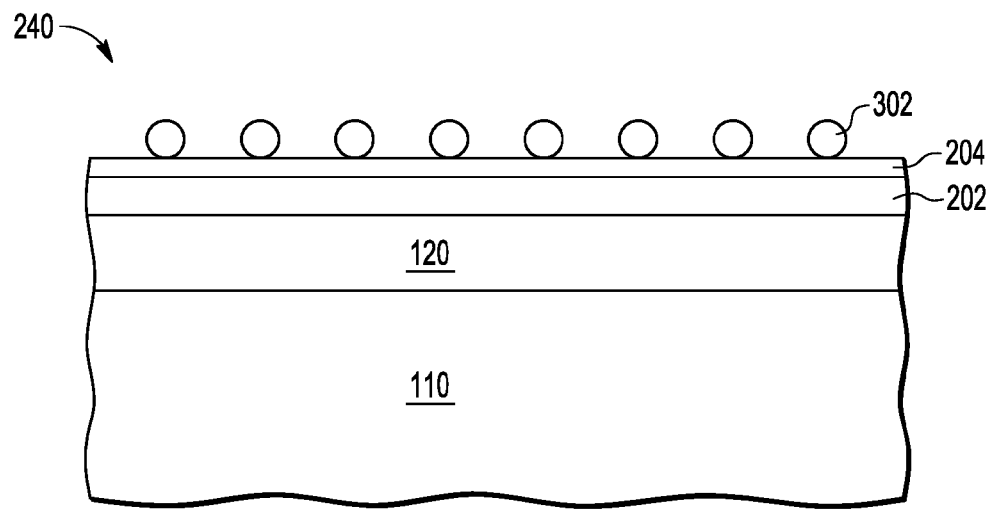
FIG. 3 is a cross-sectional side view diagram illustrating the travel stop region during a stage of fabrication subsequent to that of FIG. 2.

FIG. 3 is a cross-sectional side view diagram illustrating the cross section view of travel stop region 240 of FIG. 2 after a subsequent stage of processing during which a layer of nanocrystals or nanoclusters 302 are formed or deposited on hard mask layer 204. Nanoclusters 302 can be made of a material that includes one or more of silicon carbide, silicon germanium, polysilicon, silicon, germanium, or other suitable material. In one embodiment of the present invention, nanoclusters 302 are formed using methods known in the art of nanocrystalline silicon. For example, a low temperature, low pressure chemical vapor deposition process can be used to partially deposit polycrystalline silicon on the available surface of hard mask layer 204. An anneal process is then performed, which causes the deposited silicon to cluster and form spherical or hemispherical regions of silicon that are called nanoclusters. Alternatively, low temperature, low pressure deposition of polycrystalline germanium can be performed and used in the formation of nanoclusters 302.

Embodiments of the present invention are not limited to using silicon or germanium nanoclusters. As will be discussed more fully below, the nanocluster layer is used as a micro-masking layer for an etch that has the purpose of adding surface roughness to the hard mask layer. Any suitable material that can form nanoclusters 302 that will adhere to the surface of the hard mask layer 204 for etching is within the scope of the present invention.

Further, a variety of methods for depositing nanocrystals or nanoclusters 302 can be used (e.g., aerosol coating, spin on coating, and laser ablation and re-deposition). In one embodiment, low temperature, low pressure chemical vapor deposition is preferred because such a deposition technique fits well within a standard process flow for formation of MEMS devices.

As stated above, one goal is to decrease the surface area of the travel stop 240 that comes in contact with the travel stop region. Thus, the nanoclusters 302 formed on the hard mask layer 204 should be of sufficient size to effectively increase the roughness of the travel stop surface. In a typical MEMS device, surface roughness of a polysilicon layer formed on top of the hard mask layer is about 5 nm. To increase the roughness by five to ten times, nanoclusters 302 can be formed that have a diameter ranging from 10 to 50 nanometers can be formed to provide the desired surface roughness. Desired nanocluster size can be provided by selecting process conditions (e.g., deposition time). In addition, the nanoclusters material need not form isolated nanoclusters. Instead, the nanoclusters layer can be a network of the nanoclusters material that is configured to allow the underlying sacrificial material to be exposed to etchant for formation of a topography thereon. In one embodiment, the surface coverage of the material can be less than 90%, such that significant roughness can be introduced through the etch.

Figure 4:
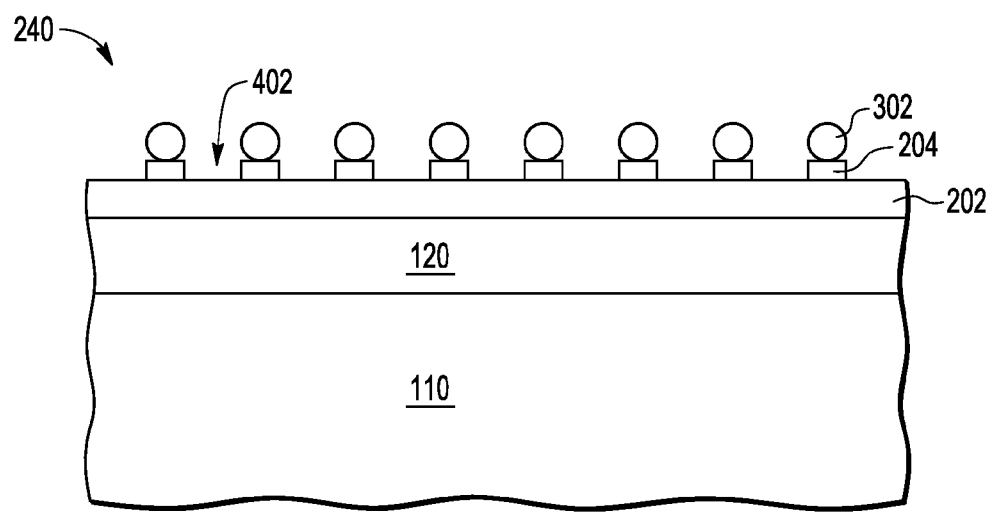
FIG. 4 is a cross-sectional side view diagram illustrating the travel stop region during use of the accelerometer.

FIG. 4 is a cross-sectional side view diagram illustrating the cross section view of travel stop region 240 of FIG. 3 after a subsequent stage of processing during which hard mask layer 204 is etched using an isotropic wet etch process selective to hard mask layer 204. Such an etch is performed by either a vapor or a liquid phase process. During the etch, the nanoclusters 302 function as a micro-masking layer and indentations 402 are formed in the surface of hard mask 204. As will be discussed more fully below, indentations 402 serve to increase the surface roughness of travel stop 240. The length of time during which the wet etch is performed should be sufficient to provide indentations 402 of a depth that will aid in formation of a sufficiently rough surface on the travel stop 240. Other types of etches, such as an anisotropic dry etch selective to the hard mask 204, can be used instead of or in addition to a wet etch.

Wet etch chemistries are dependent upon the nature of the materials being etched and those for which it is desired not to etch (e.g., the nanoclusters). For example, silicon nanoclusters will not etch in a peroxide etchant, while germanium nanoclusters etch readily in a peroxide etchant. Further, the nature of the materials used for the sacrificial layer can dictate the type of etchant materials used.

Embodiments of the present invention provide a mechanism by which the surface area of travel stop 240 that can come in contact with travel stop region 190 (FIG. 1) is reduced. As discussed above, the reduced surface area decreases the magnitude of the stiction forces. This is accomplished by roughing up at least the contact surface of travel stop 240 by modifying the surface of hard mask layer 204 at least in the region in which travel stop 190 is formed.

Figure 5:
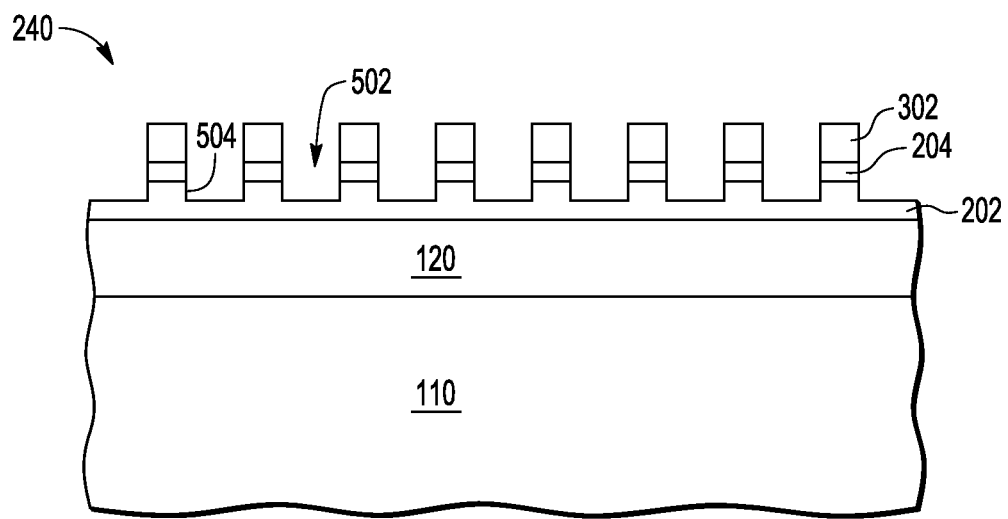
FIG. 5 is a cross-sectional side view diagram illustrating the travel stop region during a stage of fabrication performed in accord with embodiments of the present invention.

FIG. 5 is a cross-sectional side view diagram illustrating the travel stop region 240 during a stage of fabrication subsequent to that illustrated in FIG. 4 during which structural layer 202 is etched to form indentations 502 in structural layer 202. In order to form indentations that have straight sidewalls 504, as shown, a dry etch process can be used. The length of time during which the dry etch is performed should be sufficient to provide indentations 502 of a depth that will aid in formation of a sufficiently rough surface on the travel stop 240. Some portion or all of nanoclusters 302 may also be removed during the etching process. For example, rounded portions of the nanoclusters 302 may be removed to result in a more rectangular shape of nanoclusters 302 as shown in FIG. 5.

During the etch, the nanoclusters 302 and remaining portions of hard mask 204 function as a micro-masking layer as indentations 502 are formed in the surface of hard mask 204. As will be discussed more fully below, indentations 502 further increase the surface roughness of travel stop 240. The length of time during which the etch is performed should be sufficient to provide indentations 502 of a depth that will aid in formation of a sufficiently rough surface on the travel stop 240. Other types of etches, such as an isotropic wet etch selective to the structural layer 202, can be used instead of or in addition to a dry etch to form indentations 502.

Figure 6:
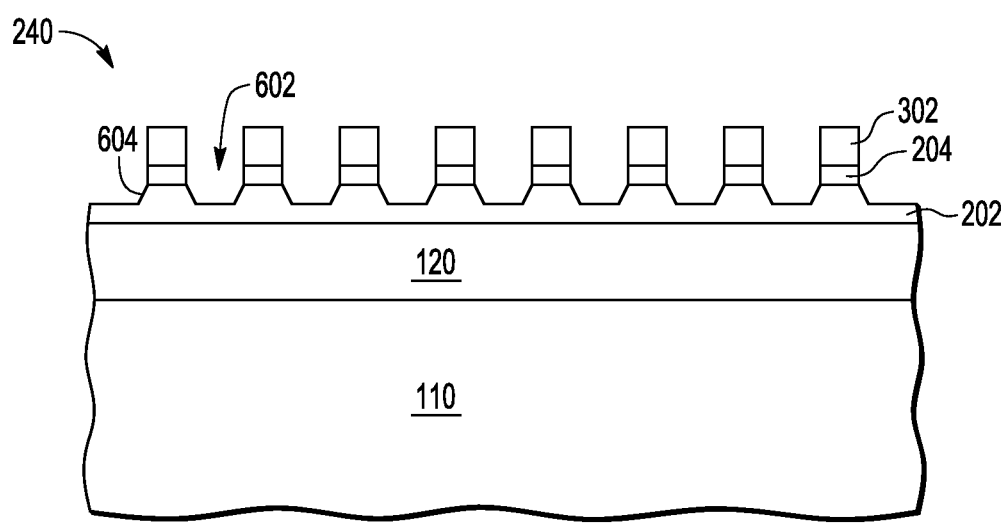
FIG. 6 is a cross-sectional side view diagram illustrating another embodiment of the travel stop region during a stage of fabrication subsequent to that illustrated in FIG. 4.

Other types of etches, such as an isotropic wet etch, will form indentations of a different shape. As an example, FIG. 6 is a cross-sectional side view diagram illustrating the travel stop region 240 during a stage of fabrication subsequent to that illustrated in FIG. 4. In order to form indentations 602 in structural layer 202 that have a curved sidewalls 604, as shown, an isotropic wet etch process selective to structural layer 202 performed by either a vapor or a liquid phase process can be used. The length of time during which the wet etch is performed should be sufficient to provide indentations of a depth that will aid in formation of a sufficiently rough surface on the travel stop 240. During the etch, the nanoclusters 302 and remaining portions of hard mask 204 function as a micro-masking layer as indentations 602 are formed in the surface of structural layer 202.

Some portion or all of nanoclusters 302 may also be removed during the etching process. For example, rounded portions of the nanoclusters 302 may be removed to result in a more rectangular shape of nanoclusters 302 as shown in FIG. 5.

Indentations 602 further increase the surface roughness of travel stop 240. The length of time during which the wet etch is performed should be sufficient to provide indentations 602 of a depth that will aid in formation of a sufficiently rough surface on the travel stop 240.

Figure 7:
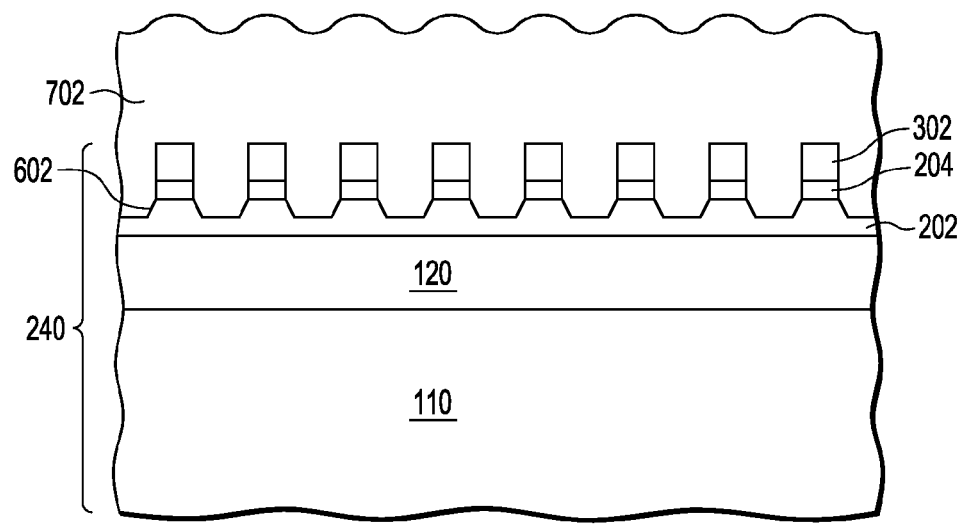
FIG. 7 is a cross-sectional side view diagram illustrating the travel stop region during a stage of fabrication subsequent to that illustrated in FIG. 6.

FIG. 7 is a cross-sectional side view diagram illustrating the travel stop region 240 during a stage of fabrication subsequent to that illustrated in FIG. 6. In FIG. 7, formation of an upper portion of an accelerometer begins by depositing sacrificial layer 702 over travel stop region 240 to form a mold for making an upper contact (not shown in FIG. 7, but similar to travel stop 190 in FIG. 1) for travel stop region 240. Sacrificial layer 702 can be made of a conformally deposited oxide or other suitable material that can be removed after the upper contact is subsequently formed.

Figure 8:
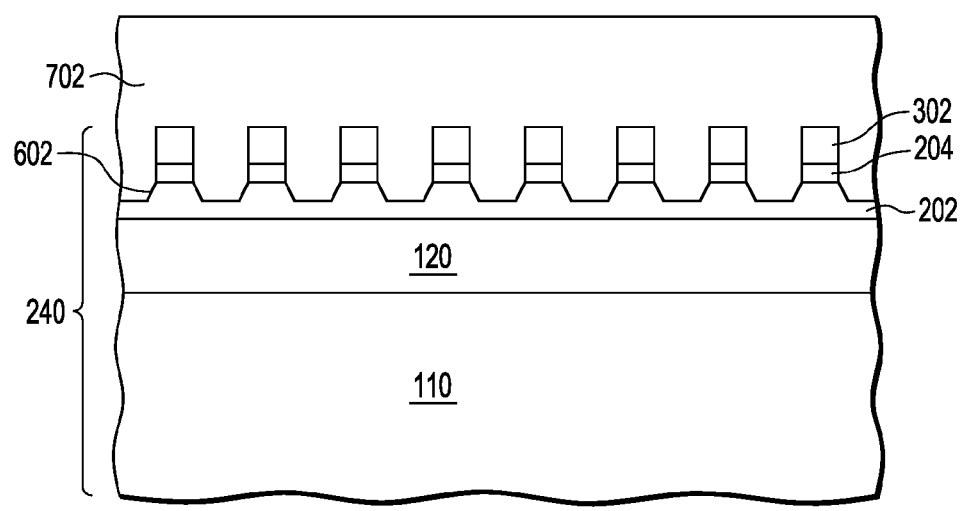
FIG. 8 is a cross-sectional side view diagram illustrating the travel stop region during a stage of fabrication subsequent to that illustrated in FIG. 7.

The sacrificial layer 702 fills indentations 602 (FIG. 6) and has an uneven top surface due to the conformal deposition over indentations 602. In order to form a smooth surface, FIG. 8 is a cross-sectional side view diagram illustrating the travel stop region 240 during a stage of fabrication subsequent to that illustrated in FIG. 7 during which the top surface of sacrificial layer 702 is polished. Any suitable process such as chemical mechanical polishing (CMP) can be used to smooth the top surface of sacrificial layer 702.

Figure 9:
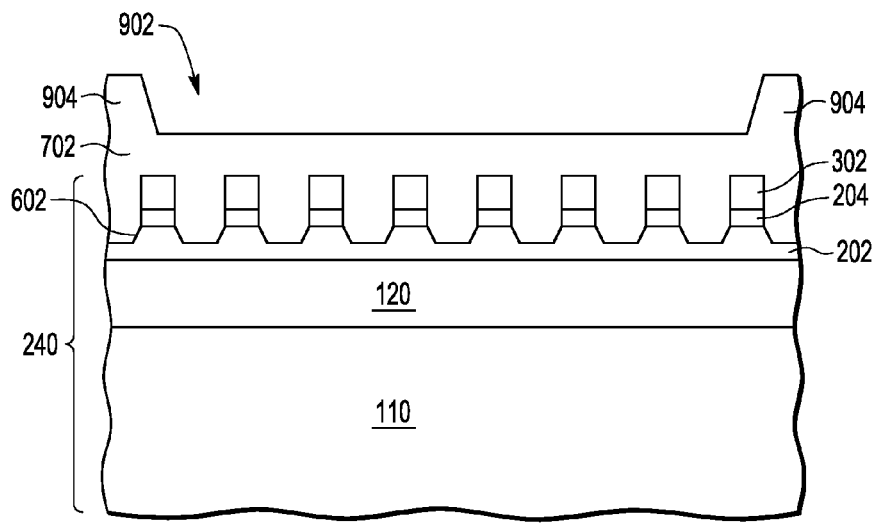
FIG. 9 is a cross-sectional side view diagram illustrating the travel stop region during a stage of fabrication subsequent to that illustrated in FIG. 8.

FIG. 9 is a cross-sectional side view diagram illustrating the travel stop region 240 during a stage of fabrication subsequent to that illustrated in FIG. 8 during which a portion of sacrificial layer 702 is removed to form a dimple 902 surrounded by sidewalls 904. Well 902 can be formed by masking sidewalls 904 and etching the unmasked portion of sacrificial layer 702 using a wet or dry etching technique. Alternatively, a portion of sacrificial layer 702 can be removed to form dimple 902 using other suitable techniques in addition to or instead of etching.

Figure 10:
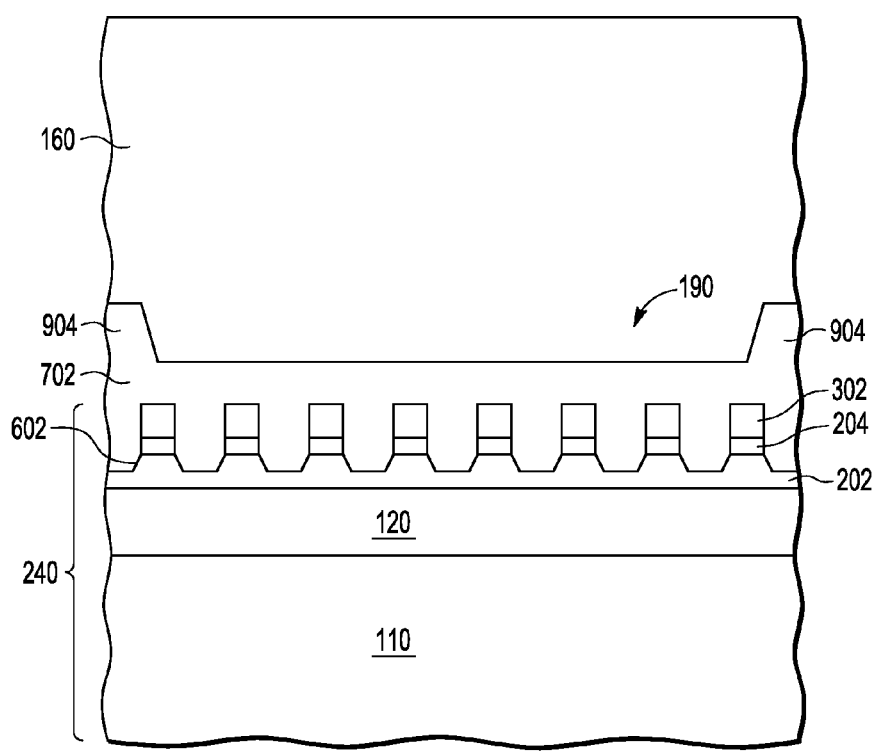
FIG. 10 is a cross-sectional side view diagram illustrating the travel stop region during a stage of fabrication subsequent to that illustrated in FIG. 9.

FIG. 10 is a cross-sectional side view diagram illustrating the travel stop region 240 during a stage of fabrication subsequent to that illustrated in FIG. 9 during which an upper layer 160 for forming the fixed electrodes 180, 185 (FIG. 1) and travel stops 190, 195 (FIG. 1) is applied over sacrificial layer 702. Note that although FIG. 10 only shows travel stop 190, the formation and etching of structural layer 202, hard mask layer 204, nanoclusters 302 and sacrificial layer 702 with one or more dimples 902 can be formed in other regions of an accelerometer to form features such as electrodes 130, 135, and travel stops 140, 145 in accelerometer 100 of FIG. 1 with roughened surfaces of travel stop region 240 of FIG. 10. Upper layer 160 can be a dielectric material, amorphous silicon, a nitride, a metal-containing material, another suitable material, and the like, or any combination thereof.

Figure 11:
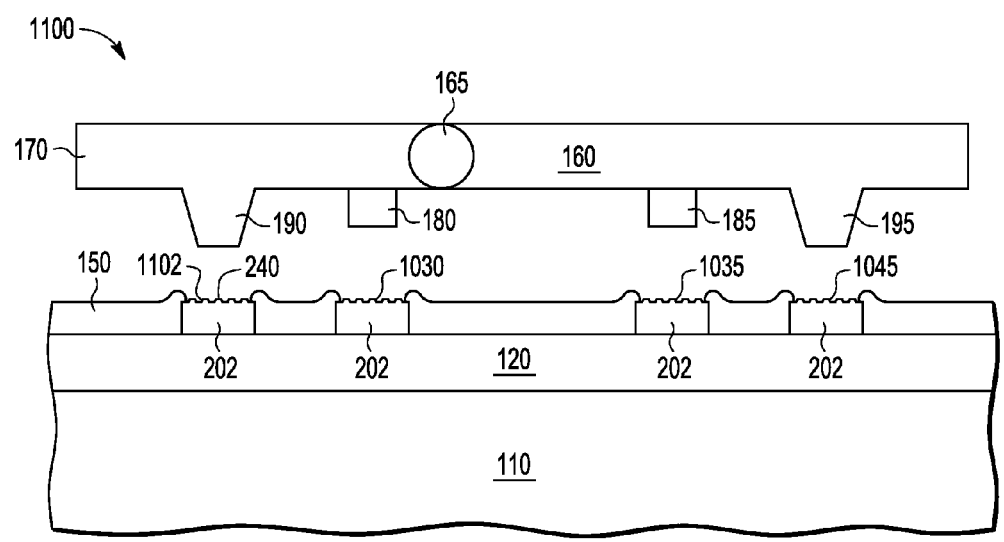
FIG. 11 is a cross-sectional side view diagram illustrating the travel stop region during a stage of fabrication subsequent to that illustrated in FIG. 10.

FIG. 11 is a cross-sectional side view diagram illustrating MEMS device 1100 that incorporates travel stop region 240 of FIG. 1 subsequent to removal of sacrificial layer 702 to free the movable portion 160 of the MEMS device. Travel stop regions 240, 1045 and electrodes 1030, 1035 each include a surface having bumps 1102. In a situation in which travel stop 190 or 195 comes in contact with travel stop region 240 or 1045, bumps 1102 reduce the contacting surface area. This reduction in surface area decreases the chance for stiction by both wet stiction and electrostatic/Van der Waals type forces.

One advantage of reducing the chances for stiction to occur in accelerometer-type MEMS devices is improved sensitivity of the device. In one type of traditional MEMS accelerometer, stiction force is countered by increasing a spring constant of the device. But increasing the spring constant decreases sensitivity of the MEMS device to light acceleration forces. In another type of traditional MEMS device, chances for stiction occurring are sought to be reduced by increasing the distance between the movable portions of the device and the fixed portions of the device. But this increases the distance between the capacitive plates and can therefore decrease differences in measured capacitance. Reducing stiction forces by using embodiments of the present invention allow for lower spring constants and smaller distances between parts, both of which can improve device sensitivity. Further, smaller overall device sizes can be realized by decreasing the distances between the parts. This can, in turn, provide a decreased footprint for each MEMS device, thereby allowing for incorporation of more MEMS devices in a system or a smaller system size.

By now it should be appreciated that in some embodiments, there has been provided a method for manufacturing a micro electromechanical systems device, in which the method can include forming a structural layer (202) over a substrate (110), and forming a mask layer (204) over the structural layer. The mask layer is formed with a material selective to an etching process. A plurality of nanoclusters (302) are formed on the mask layer. The nanoclusters are used as a mask for removing portions of the mask layer. The structural layer is etched using remaining portions of the mask layer as a mask for the etching of the structural layer.

In another aspect, the etching process can include a first etching process (FIG. 4) for the removing portions of the mask layer; and a second etching process (FIG. 5) operable to etch the structural layer.

In another aspect, performing the second etching process can further comprise removing the plurality of nanoclusters.

In another aspect, the etching process can comprise an anisotropic etch.

In another aspect, the etching process can comprise an isotropic etch.

In another aspect, the method can further comprise forming a sacrificial layer (702) on the etched structural layer; and forming a second structural layer (1002) over the sacrificial layer.

In another aspect, the method can further comprise planarizing a portion of the sacrificial layer prior to forming the second structural layer (FIG. 8).

In another aspect, a nanocluster can comprise one of silicon carbide, silicon germanium, polysilicon, silicon, or germanium. The nanocluster can be one of the plurality of nanoclusters.

In another aspect, the structural layer can comprise a structural layer.

In another aspect, the material selective to the etching process can comprise a silicon oxide.

In other embodiments, a microelectromechanical systems (MEMS) device can comprise a fixed surface (140, 145) including a first structural layer (202) formed over a substrate (110). The first structural layer can have a plurality of surface roughness features (302) having an aspect ratio of at least 2:1.

In another aspect, the MEMS can further comprise a movable body (160) comprising a second structural layer providing a major surface (190, 195) facing the fixed surface.

In another aspect, the movable body can comprise a pivoting proof mass (180, 185) of a teeter-totter accelerometer, and a travel stop feature (190, 195) configured to contact the first structural layer to prevent over rotation of the pivoting proof mass and comprising a portion of the major surface facing the fixed surface.

In another aspect, the fixed surface can be formed using a process comprising forming a structural layer over a substrate, forming a mask layer over the structural layer, and forming a plurality of nanoclusters on the mask layer. The plurality of nanoclusters ca be formed with a material selective to an etching process. The structural layer can be etched using at least the etching process.

In another aspect, the fixed surface can be formed using a process comprising forming a structural layer over a substrate, forming a mask layer over the structural layer, and forming a plurality of nanoclusters on the mask layer. The plurality of nanoclusters can be formed with a material selective to an etching process. The structural layer can be etched using at least the etching process. A portion of the travel stop feature can be formed using a process comprising forming a sacrificial layer on the etched structural layer, and forming a second structural layer over the sacrificial layer.

In another aspect, the portion of the travel stop feature can be formed using a process further comprising planarizing a portion of the sacrificial layer prior to forming the second structural layer.

In another aspect, a nanocluster can comprise one of silicon carbide, silicon germanium, polysilicon, silicon, or germanium, wherein the nanocluster is one of the plurality of nanoclusters.

In still other embodiments, a method for manufacturing a microelectromechanical systems (MEMS) device can include forming a fixed surface having a portion facing a major surface of a movable body, wherein the portion of the fixed surface is operable to contact at least a portion of the major surface. The portion of the fixed surface can be formed such that the portion comprises a plurality of surface roughness features having an aspect ratio of at least 2:1. The movable body can then be formed.

In another aspect, the portion of the fixed surface can be formed such that the portion comprises the plurality of surface roughness features having an aspect ratio of at least 2:1 by forming a structural layer over a substrate, and forming a mask layer over the structural layer. The mask layer can be formed with a material selective to an etching process. A plurality of nanoclusters can be formed on the mask layer. The structural layer can be etched using at least the etching process.

In another aspect, the method can further comprise forming a sacrificial layer on the etched structural layer; and forming a second structural layer over the sacrificial layer.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the description of embodiments of the invention relates to a teeter-totter type accelerometer. Embodiments of the present invention are not limited to teeter-totter accelerometers, but can include accelerometers having a mass suspended by springs, or other MEMS devices that have a potential for components to come in contact with one another during operation or manufacture. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for manufacturing a microelectromechanical systems (MEMS) device, the method comprising:
    forming a structural layer over a substrate;
    forming a mask layer over the structural layer, wherein the mask layer is formed with a material selective to an etching process;
    forming a plurality of nanoclusters on the mask layer;
    using the nanoclusters as a mask for removing portions of the mask layer; and
    etching the structural layer using remaining portions of the mask layer as a mask for the etching of the structural layer forming a plurality of surface roughness features on a travel stop of the MEMS device.

2. The method of claim 1, wherein the etching process comprises:
    a first etching process for the removing portions of the mask layer; and
    a second etching process operable to etch the structural layer.

3. The method of claim 2, wherein performing the second etching process further comprises removing the plurality of nanoclusters.

4. The method of claim 1, wherein the etching process comprises an anisotropic etch.

5. The method of claim 1, wherein the etching process comprises an isotropic etch.

6. The method of claim 1, further comprises:
    forming a sacrificial layer on the etched structural layer; and
    forming a second structural layer over the sacrificial layer.

7. The method of claim 6, further comprising planarizing a portion of the sacrificial layer prior to forming the second structural layer.

8. The method of claim 1, wherein a nanocluster comprises one of silicon carbide, silicon germanium, polysilicon, silicon, or germanium, wherein the nanocluster is one of the plurality of nanoclusters.

9. The method of claim 1, wherein the structural layer comprises a polysilicon layer.

10. The method of claim 1, wherein the material selective to the etching process comprises a silicon oxide.

11. A method for manufacturing a microelectromechanical systems (MEMS) device, the method comprising:
    forming a structural layer over a substrate;
    forming a mask layer over the structural layer;
    forming a plurality of nanoclusters on the mask layer;
    using the nanoclusters as a mask for removing portions of the mask layer; and
    etching the structural layer using remaining portions of the mask layer as a mask for the etching of the structural layer forming a plurality of surface roughness features of a travel stop feature of the MEMS device; and
    forming a movable body, wherein the structural layer forms a fixed surface having a portion facing a major surface of the movable body, and the fixed surface is operable to contact at least a portion of the plurality of surface roughness features.

12. The method of claim 11, further comprising:
    forming a sacrificial layer on the etched structural layer; and
    forming a second structural layer over the sacrificial layer.

13. The method of claim 11, wherein the movable body comprises:
    a pivoting proof mass of a teeter-totter accelerometer;
    the travel stop feature is configured to contact the structural layer to prevent over rotation of the pivoting proof mass, and comprises a portion of the major surface facing the fixed surface.

14. The method of claim 13, wherein:
    a portion of the travel stop feature is formed using a process comprising:
        forming a sacrificial layer on the etched structural layer; and
        forming a second structural layer over the sacrificial layer.

15. The method of claim 14, wherein the portion of the travel stop feature is formed using a process further comprising planarizing a portion of the sacrificial layer prior to forming the second structural layer.

16. The method of claim 11, wherein the plurality of nanoclusters are formed of one of silicon carbide, silicon germanium, polysilicon, silicon, or germanium.

* * * * *